United States Patent [19]

Miyazawa

[11] Patent Number: 4,849,935
[45] Date of Patent: Jul. 18, 1989

[54] SEMICONDUCTOR MEMORY INCLUDING TRANSPARENT LATCH CIRCUITS

[75] Inventor: Yuichi Miyazawa, Tokyo, Japan

[73] Assignee: Kasuhiki Kaisha Toshiba, Kawasaki, Japan

[21] Appl. No.: 113,204

[22] Filed: Oct. 27, 1987

[30] Foreign Application Priority Data

Mar. 25, 1987 [JP] Japan .................. 62-70765

[51] Int. Cl.$^4$ ............................................. G11C 7/00
[52] U.S. Cl. ............................. 365/189.05; 365/210; 365/203; 365/204
[58] Field of Search ............... 365/210, 104, 105, 175, 365/190, 203, 204, 233, 189, 205

[56] References Cited

U.S. PATENT DOCUMENTS

| | | | |
|---|---|---|---|
| 4,044,341 | 8/1977 | Stewart et al. | 365/210 |
| 4,334,157 | 6/1982 | Ferris | 365/205 |
| 4,627,032 | 12/1986 | Kolwicz et al. | 365/210 |
| 4,644,501 | 2/1987 | Nagasawa | 365/210 |
| 4,661,927 | 4/1987 | Graebel | 365/210 |
| 4,750,839 | 6/1988 | Wang et al. | 365/230 |

OTHER PUBLICATIONS

S. Muroga, "Mask-Programmable ROM", VLSI System Design, Chapter 6, Sec. 4, 1982.

Primary Examiner—Stuart N. Hecker
Assistant Examiner—Glenn A. Gossage
Attorney, Agent, or Firm—Finnegan, Henderson, Farabow, Garrett & Dunner

[57] ABSTRACT

A semiconductor memory having latch circuits, each of which is coupled to receive the potential of a bit line and which can operate, in response to a control signal, in either a through mode or a latch mode. In the through mode, the latch circuit outputs the potential of the bit line. In the latch mode, it latches this potential and then outputs it. The memory further comprises a dummy bit line and FETs. These FETs are provided at the intersections of the dummy bit line and all word lines of the memory. Hence, the dummy bit line is discharged whenever a word line has been selected. The latch circuits, which are provided in the output section of the memory, are set to the through mode when the dummy bit line is discharged to a predetermined potential.

10 Claims, 4 Drawing Sheets

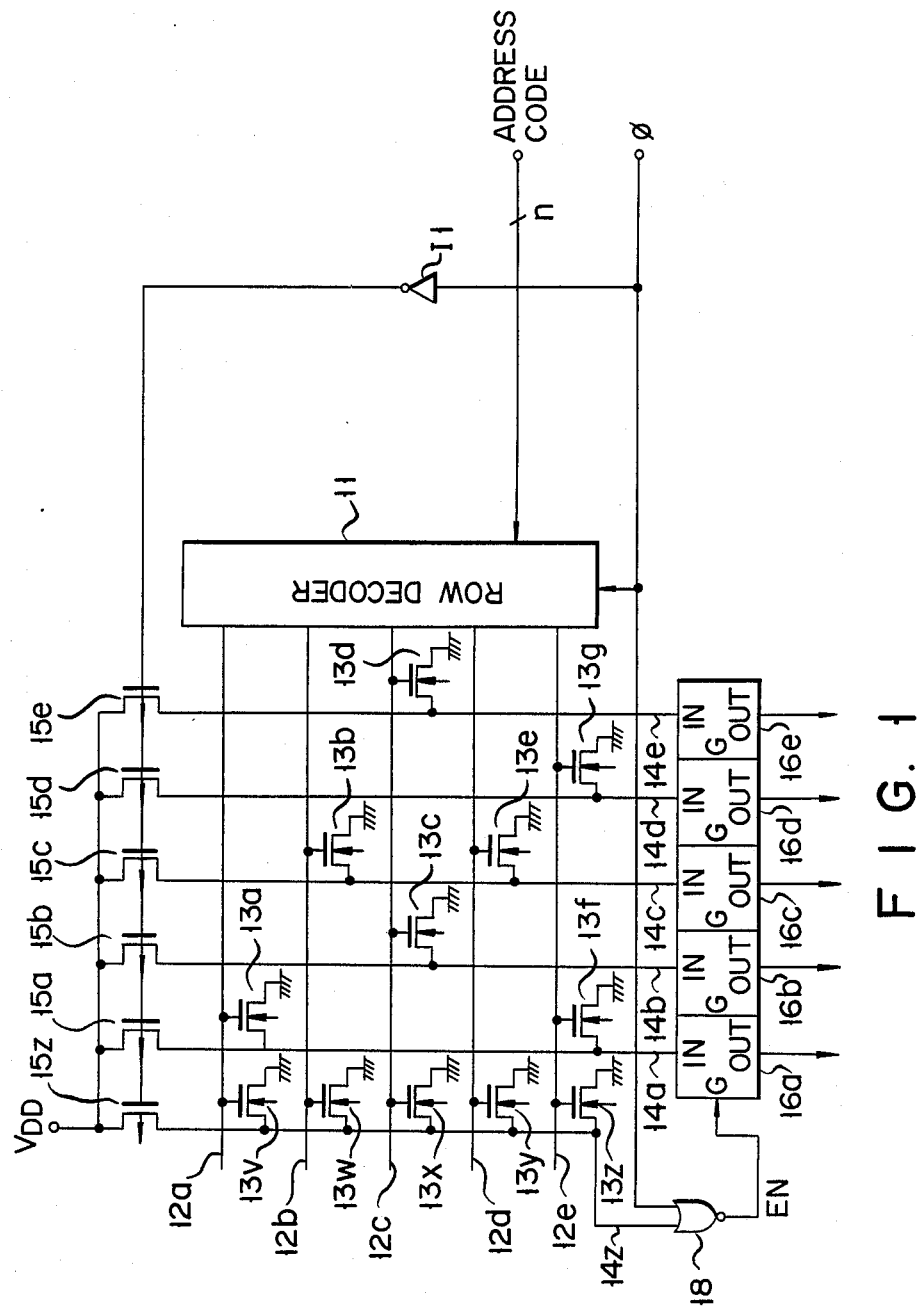
F I G. 1

SEMICONDUCTOR MEMORY INCLUDING TRANSPARENT LATCH CIRCUITS

BACKGROUND OF THE INVENTION

The present invention relates to a semiconductor memory and, more particularly, to a semiconductor memory that can latch output data.

Generally, in a memory such as a ROM or a RAM incorporated into a logic LSI, a latch circuit is provided for each of the bit lines, in order to prevent erroneous data from being read out from the memory cells to a peripheral circuit. More specifically, the latch circuit latches the potential of the bit line at a prescribed timing, and outputs the latched potential to the peripheral circuit.

In a synchronous ROM, for example, the potentials of all bit lines are precharged to a positive value during the high or H level half cycle of a clock signal by a precharge circuit. Also, during the H level half cycle of the clock signal, a row decoder decodes an address code. When the clock signal falls from an H level to a low or L level, the positive potential is applied by the row decoder to a selected word line. A transistor coupled at the intersection of the selected word line and any bit line discharges this bit line, whereby the potential of the bit line falls to the L level. The potentials of the other bit lines remain at the H level, i.e., the precharge level. The latch circuits provided for each of the bit lines are switched from a latch mode to a through mode when the potential of every bit line is set to the H level or the L level. Therefore, only the potential of each bit line thus established is output to the peripheral circuit. The potential of any bit line, which is changing from the H level to the L level as the bit line is discharged by the transistor, i.e., an erroneous data, is not output to the peripheral circuit.

The operation mode of each latch circuit is also controlled by the clock signal. Usually, a delay circuit outputs a control signal upon the lapse of a predetermined period after the clock signal falls from the H level to the L level. This control signal switches the operation mode of the latch circuit from the latch mode to the through mode.

Hence, if the delay time set in the delay circuit is appropriate, the potential of any bit line can be output at the time the potential is set to the H level or the L level. In this case, correct data can be read from the memory at high speed. However, it is extremely difficult to set a proper delay time in the delay circuit. The period between the time the clock signal falls from the H level to the L level and the time the potential of the bit line is set is the sum of the period required for the potential of the word line to rise to a predetermined value and the discharge period of the bit line. The discharge period is determined by the inherent capacitance of the bit line and also by the diffusion capacitance of the transistor coupled to this bit line. In particular, it is difficult to correctly calculate the proper delay time for the recently-developed LSI memory having a multi-layer wiring structure, since many conductive layers cross each bit line, and it is difficult to determine the individual capacitances between the bit line, on the one hand, and each of these layers, on the other.

When the delay time set in the delay circuit is too short, the latch circuit is switched to the through mode before the potential of the bit line is established. In this case, the memory reads out erroneous data, causing errors in the peripheral circuit, or resulting in an increase in the power consumption of the latch circuit. Conversely, when the delay time set in the delay circuit is sufficiently long to prevent the reading of erroneous data, the access time of the memory is lengthened, in which case, the operation speed of the peripheral circuit is inevitably reduced.

SUMMARY OF THE INVENTION

An object of the present invention is to provide a semiconductor memory which reads only correct data, and which can do so at high speeds, by switching latch circuits from a latch mode to a through mode, at an appropriate timing.

According to this invention, there is provided a semiconductor memory having latch circuits, each of which is coupled to receive the potential of a bit line, and each of which can operate, in response to a control signal, in a through mode, so as to output the potential of the bit line, or in a latch mode, so as to latch and then output this potential. The semiconductor memory further comprises a dummy bit line; a precharge circuit for precharging the dummy bit line and other bit lines to a predetermined potential; a plurality of discharge means provided at the intersections of all word lines and the dummy bit line, for discharging the dummy bit lines when the corresponding word lines are enabled by a row decoder; and control signal generator means for generating a control signal for switching the latch circuits to the through mode when the dummy bit line is discharged from the precharge potential to a predetermined potential.

BRIEF DESCRIPTION OF THE DRAWINGS

FIG. 1 is a circuit diagram showing a semiconductor memory according to a first embodiment of the present invention;

DETAILED DESCRIPTION OF THE PREFERRED EMBODIMENTS

Figure 2:
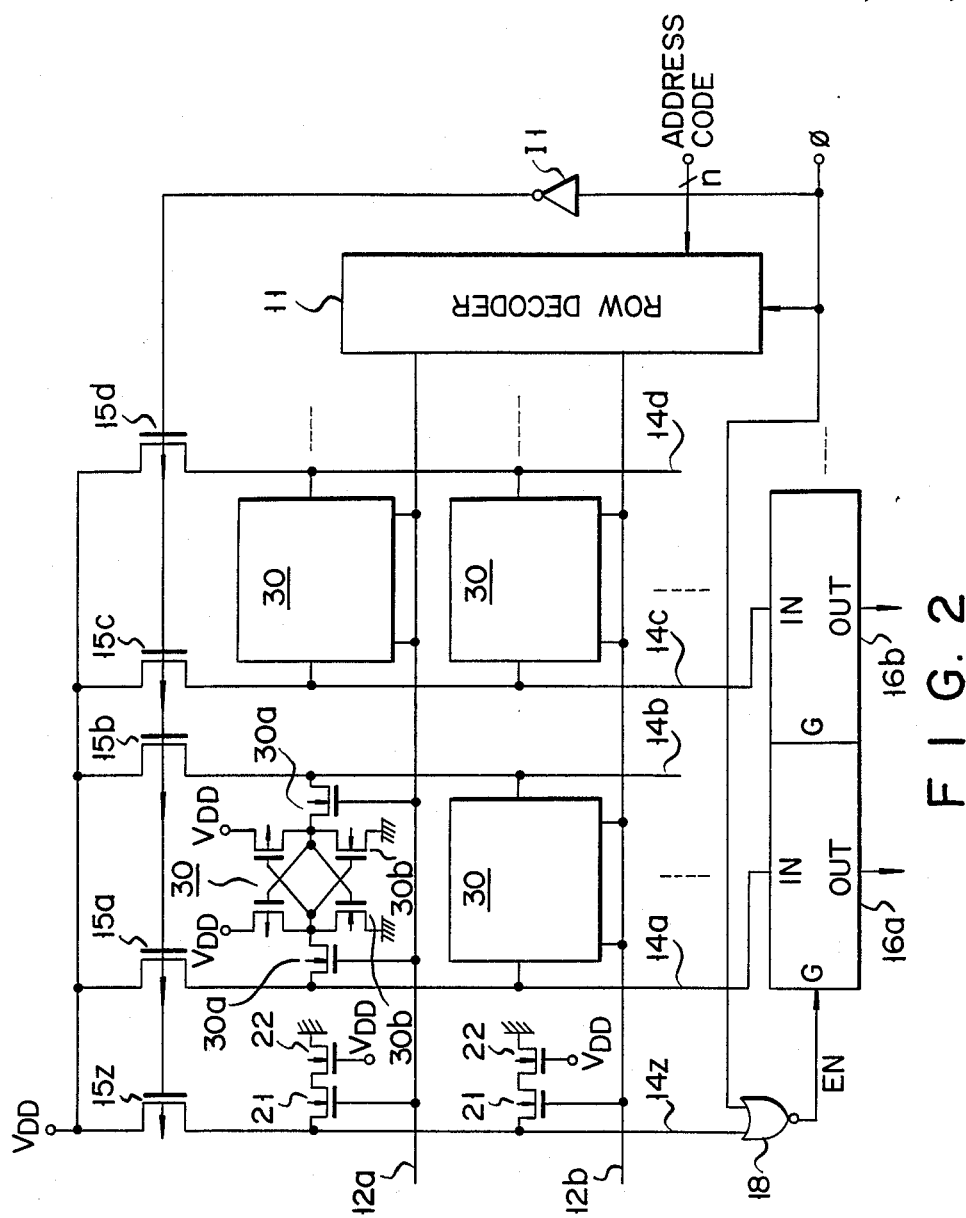
FIG. 2 is a circuit diagram showing a semiconductor memory according to a second embodiment of the invention.

FIG. 1 shows a circuit diagram of a semiconductor memory according to a first embodiment of the invention. In this semiconductor memory, bit lines 14a to 14e are precharged during the first half cycle of each clock pulse. During the second half cycle of each clock pulse, the memory reads data. The semiconductor memory is, therefore, a synchronous ROM. This memory comprises latch circuits 16a to 16e all of which can be set in a through mode by enable signal EN. Enable signal EN is generated from a potential on dummy bit line 14z.

The ROM of FIG. 1 comprises a row decoder 11, word lines 12a to 12e, N-type MOSFETs 13a to 13g, bit lines 14a to 14e, P-type MOSFETs 15a to 15e, latch circuits 16a to 16e, and a dummy bit line 14z. Row decoder 11 decodes an n-bit address, thereby selecting one of word lines 12a to 12e, and applies a positive potential to the selected word line every time clock signal φ falls from the high or H level to the low or L level. Bit lines 14a to 14e extend at right angles to word lines 12a to 12e. N-type MOSFETs 13a to 13g are provided at some of the intersections of word lines 12a to 12e and bit lines 14a to 14e, thereby storing data in the ROM. Each of the N-type MOSFETs discharges the bit line to which it is coupled, when the word line, to which it is connected, is selected. P-type MOSFETs 15a to 15e have their gates connected to the output of inverter I1. Clock signal $\phi$ is supplied to their gates via inverter I1. P-type MOSFETs 15a to 15e precharge bit lines 14a to 14e, respectively, as long as clock signal $\phi$ remains at the H level. Latch circuits 16a to 16e can latch and output signals on bit lines 14a to 14e. Dummy bit line 14z is provided in order to determine the time at which latch circuits 16a to 16e should be set in the through mode.

A precharging P-type MOSFET 15z is connected to dummy bit line 14z. The ROM further comprises N-type MOSFETs 13v to 13z which are provided at the intersections of dummy bit line 14z and word lines 12a to 12e. These N-type MOSFETs 13v to 13z have the same channel width W, the same channel length L, and the same threshold voltage, as N-type MOSFETs 13a to 13g, which are used as memory cells and connected to the bit lines 14a to 14e.

The ROM has a two-input NOR gate 18. Dummy bit line 14z is connected to the first input of NOR gate 18, and clock signal $\phi$ is supplied to the second input thereof. The output signal of NOR gate 18 is supplied as enable signal EN to latch circuits 16a to 16e.

The operation of this ROM will now be explained. As long as clock signal $\phi$ is at the H level, P-type MOSFETs 15a to 15e are turned on by the output of inverter I1. All bit lines 14a to 14e, and dummy bit line 14z are thus precharged to power-source potential $V_{DD}$, i.e., the H level. In the meantime, row decoder 11 decodes an address code. When clock signal $\phi$ falls to the L level, row decoder 11 supplies a positive potential to that one of word lines 12a to 12e that has been selected. When the potential of the selected word line rises to the H level, the N-type MOSFET provided at the intersection of this word line and one of bit lines 14a to 14e is turned on, whereby the bit line is discharged to 0 V. One of N-type MOSFETs 13v to 13z is turned on, depending on which word line, i.e., 12a, 12b, 12c, 12d, and 12e, is selected. Therefore, dummy bit 14z is discharged in the same way as one of the bit lines. The speed at which the potential of dummy bit line 14z is less than the speed at which the potential of any bit line falls. This is because N-type MOSFETs are coupled to all word lines 12a to 12e, so dummy bit line 14z has a parasitic capacitance greater than that of any of bit lines 14a to 14e. A bit line is not discharged, and thus remains at the H level, if there is no FET provided at the intersection of that bit line and the selected word line. The output of NOR gate 18, i.e., enable signal EN supplied to latch circuits 16a to 16e, rises to the H level when the potentials of bit lines 14a to 14e are established, and hence, latch circuits 16a to 16e output established data.

When N-type MOSFETs are provided at all intersections of one of bit lines 14a to 14e and all word lines, thereby re-programming the ROM, the potential of dummy bit 14z falls at the same speed as the potential of the bit line. Also in this case, no unestablished data is output from latch circuits 16a to 16e.

Therefore, only established data can be read out from the ROM at as high a speed as possible, without the risk of having been corrupted.

FIG. 2 shows a second embodiment of this invention, i.e., a static RAM. As is illustrated in this figure, memory cells 30 are connected to bit lines 14a to 14d, for controlling the potentials of these bit lines. N-type MOSFETs 21 and 22 are provided at each of the intersections of dummy bit lines 14z and all word lines 12a, 12b, . . . N-type MOSFETs 21 and 22 are connected in series betwen dummy bit line 14z and a ground terminal. The gate of MOSFET 21 is coupled to the word line, and the gate of MOSFET 22 is connected to power-supply potential $V_{DD}$. The threshold voltage and width-to-length ratio (hereinafter abbreviated as "W/L") of N-type MOSFET 21 are identical to those of FET 30a of memory cell 30, which is used for transferring data. The threshold voltage and W/L of N-type MOSFET 22 are identical to those of FET 30b of memory cell 30.

In this static RAM shown in FIG. 2, the speed at which the potential of dummy bit line 14z falls is the same as the speed at which the potential of any bit line falls. Thus, only established data can be read from this static RAM, as from the ROM illustrated in FIG. 1.

Figure 3:
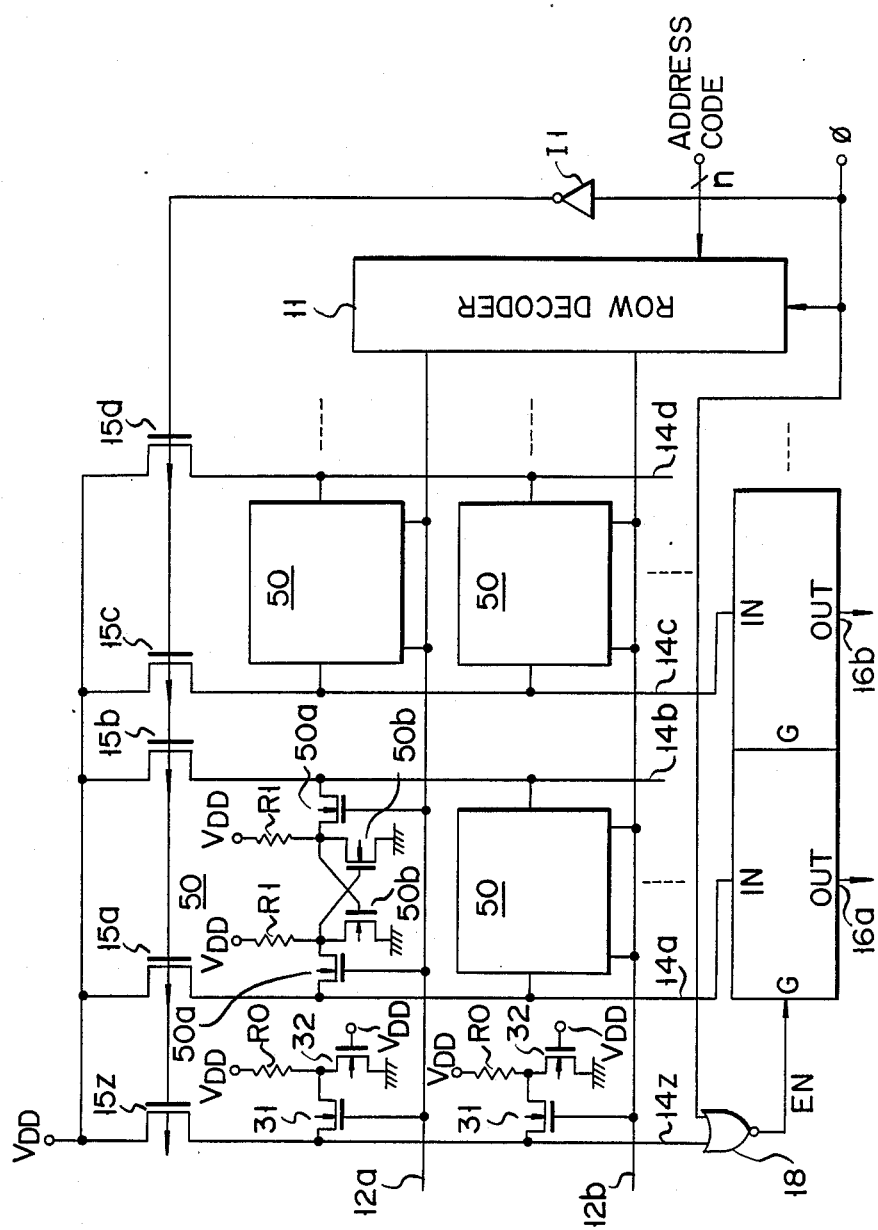
FIG. 3 is a circuit diagram showing a semiconductor memory according to a third embodiment of this invention.

FIG. 3 shows a third embodiment of the invention, i.e., a static RAM with memory cells 50 of a resistive load type, not having a CMOS structure, as in the case of the static RAM of FIG. 2. As is shown in FIG. 3, discharge circuits, each comprising N-type MOSFETs 31 and 32 and resistor R0, are provided at the intersections of dummy bit lines 14z and all word lines 12a, 12b, . . . . In each discharge circuit, N-type MOSFETs 31 and 32 are connected in series between dummy bit line 14z and a ground terminal. Resistor R0 is connected between power-source potential $V_{DD}$ and the connection point of these N-type MOSFETs. The gate of MOSFET 31 is coupled to the corresponding word line. The gate of MOSFET 32 is coupled to power-source potential $V_{DD}$. The resistance of resistor R0 is the same as that of load resistor R1 of each memory cell 50. The threshold voltage and W/L of N-type MOSFET 31 are identical to those of FET 50a of memory cell 50, which is used for transferring data. The threshold voltage and W/L of N-type MOSFET 32 are identical to those of FET 50b of memory cell 50.

Each discharge circuit can be current-driven with the same efficiency as memory cells 50 while it is performing its function. The potential of dummy bit line 14z, therefore, falls at the same speed as that of all the bit lines. Hence, latch circuits 16a, 16b, . . . output only established data.

Figure 4:
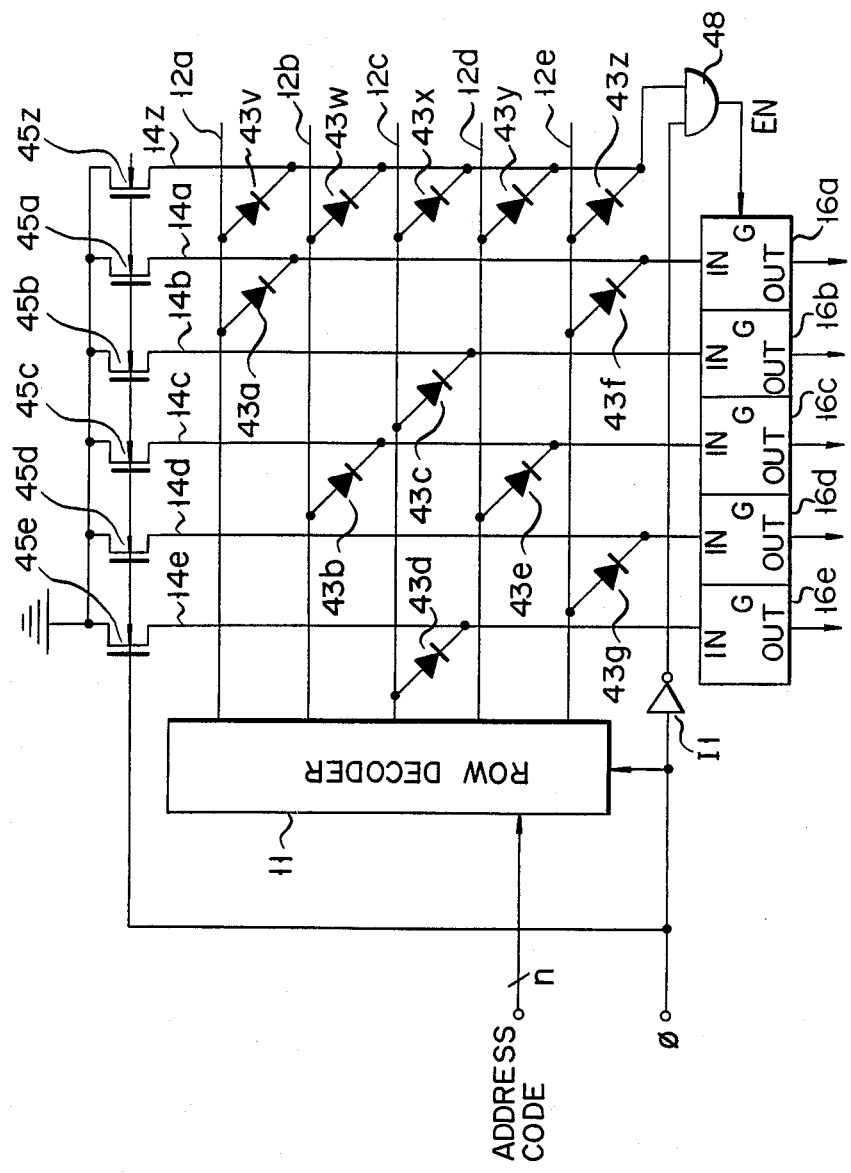
FIG. 4 is a circuit diagram showing a semiconductor memory according to a fourth embodiment of the present invention.

FIG. 4 shows a fourth embodiment of the present invention, i.e., a bipolar-type ROM. As is shown in this figure, the bipolar-type ROM comprises parallel word lines 12a to 12e, parallel bit lines 14a to 14e crossing word lines 12a to 12e, a row decoder 11, PN diodes 43a to 43g, N-type MOSFETs 45a to 45e, latch circuits 16a to 16e, and a dummy bit line 14a. Row decoder 11 decodes an n-bit address code, thus selecting one of word lines 12a to 12e, and applies a positive potential to the selected word line when clock signal $\phi$ rises from the L level the H level. PN diodes 43a to 43g are provided at some of the intersections of word lines 12a to 12e and bit lines 14a to 14e. N-type MOSFETs 45a to 45e are connected to bit lines 14a to 14e, respectively. The gate of each N-type MOSFET is connected to receive clock signal $\phi$. As long as clock signal $\phi$ is at the H level, this N-type MOSFET discharges the corresponding bit line to 0V. Latch circuits 16a to 16e latch the signals on bit lines 14a to 14e, respectively, and then output these signals. Dummy bit line 14z is provided for setting these latch circuits to the through mode at a desired time.

A discharging N-type MOSFET 45z is coupled at dummy bit line 14z. PN diodes 43v to 43z are provided at the intersections of dummy bit line 14z and word lines 12a to 12e. These PN diodes 43v to 43z have the same PN-junction area as PN diodes 43a to 43g coupled to bit lines 14a to 14e.

Dummy bit lines 14z is connected to one of the two inputs of an AND gate 48. Clock signal φ is supplied to the other input of AND gate 48 via inverter I1. The output of AND gate 48 is supplied to latch circuits 16a to 16e, as enable signal EN.

In the bipolar ROM shown inn FIG. 4, one of PN diodes 43v to 43z is turned on, depending on which word line, 12a, 12b, 12c, or 12d, has been selected. Hence, dummy bit line 14z is charged without fail. In addition, the potential of dummy bit line 14z rises at a lower speed than does any bit line. This is because PN diodes, provided for word lines 12a to 12e, are connected to dummy bit line 14z, and dummy bit line 14z has therefore a parasitic capacitance greater than that of any bit line.

Hence, the output of AND gate 48, i.e., enable signal EN supplied to latch circuits 16a to 16e, rises to the H level only after the potentials of bit lines 14a to 14e have been established. As a result, latch circuits 16a to 16e output only established data.

What is claimed is:

1. A semiconductor memory including a plurality of bit lines and a plurality of latch circuits, each of which is coupled to receive the potential of a corresponding bit line and which can operate, in response to a control signal, in a through mode, to output the potential of the corresponding bit line, or in a latch mode, to latch and then output this potential, said memory comprising:
   clock means for generating a cyclic clock signal;
   a dummy bit line;
   a precharge circuit for precharging the dummy bit line and said plurality of bit lines to a precharge potential during a first half of a clock cycle;
   a plurality of discharge means respectively provided at the intersections of a plurality of word lines and said dummy bit line, for discharging the dummy bit line during a latter half of the clock cycle when the corresponding word lines are enabled by a row decoder; and
   control signal generator means for generating a control signal for setting the latch circuits to the latch mode at the beginning of the first half of the clock cycle and for generating a control signal for switching the latch circuits from the latch mode to the through mode during the latter half of the clock cycle when the dummy bit line is discharged by one of the discharge means from the precharge potential to a predetermined potential.

2. The semiconductor memory according to claim 1, wherein said latch circuits are switched from the latch mode to the through mode when said control signal rises from a low level to a high level, and are switched from the through mode to the latch mode when said control signal falls from the high level to the low level.

3. The semiconductor memory according to claim 1, wherein each of said plurality of said discharge means has substantially the same structure as a memory cell of the memory.

4. The semiconductor memory according to claim 3, wherein said each of said plurality of discharge means has the same current-drive ability as that with which said memory cell discharges a bit line, and provides said dummy bit line with a capacitance which is the same as the capacitance which a memory cell imparts to a bit line.

5. The semiconductor memory according to claim 3, wherein said memory cell and each of said discharge means includes an N-type MOSFET whose source-drain path is connected between a corresponding bit line and a ground terminal, and whose gate is coupled to a corresponding word line.

6. A semiconductor memory including a plurality of bit lines and a plurality of latch circuits, each of which is coupled to receive the potential of a corresponding bit line and which can operate, in response to a control signal, in a through mode, to output the potential of the corresponding bit line, or in a latch mode, to latch and then output this potential, said memory comprising:
   clock means for generating a cyclic clock signal;
   a dummy bit line;
   a discharge circuit for discharging said dummy bit line and said plurality of bit lines to a discharge potential during a first half of a clock cycle;
   a plurality of charge means respectively provided at the intersections of a plurality of word lines and said dummy bit line, for charging said dummy bit line during a latter half of the clock cycle when the corresponding word lines are enabled by a row decoder; and
   control signal generator means for generating a control signal for setting the latch circuits to the latch mode at the beginning of the first half of the clock cycle and for generating a control signal for switching the latch circuits from the latch mode to the through mode during the latter half of the clock cycle when said dummy bit line is charged by one of said charge means to have a potential raised from the discharge potential to a predetermined potential.

7. The semiconductor memory according to claim 6, wherein memory cells for controlling the potentials of said bit lines are provided at some of the intersections of said bit lines and said word lines, and each of said charge means and each of said memory cells include a PN diode whose anode is connected to the corresponding word line, and whose cathode is connected to the corresponding bit line.

8. The semiconductor memory according to claim 6, wherein said latch circuits are switched from the latch mode to the through mode when said control signal rises from a low level to a high level, and are switched from the through mode to the latch mode when said control signal falls from the high level to the low level.

9. A synchronous semiconductor memory, comprising:
   a plurality of bit lines;
   latch circuits, each of which is ocupled to receive the potential of a corresponding bit line and which can operate, in response to a control signal rising from a low level to a high level, in a through mode to output the potential of the corresonding bit line, or, in respone to the control signal falling from the high level to the low level, in a latch mode to latch and then output this potential;
   clock means for generating a cyclic clock signal;
   a dummy bit line;

a precharge circuit for precharging the dummy bit line and said plurality of bit lines to a precharge potential during a first half of a clock cycle;

a plurality of discharge means respectively provided at the intersections of plurality of word lines and said dummy bit line, for discharging the dummy bit line, during the latter half of a clock cycle when the corresponding word lines are enabled by a row decoder; and a two input NOR gate, the first input receiving said clock signal and the second input receiving the potential of said dummy bit line, for generating a control signal for setting the latch circuits to the latch mode at the beginning of the first half of the clock cycle and for generating a control signal for switching the latch circuits from the latch mode to the through mode during the latter half of the clock cycle when the dummy bit line is discharged by one of the discharge means from the precharge potential to a predetermined potential.

10. A synchronous semiconductor memory, comprising:

a plurality of bit lines;

latch circuits, each of which is coupled to receive the potential of a corresponding bit line and which can operate, in response to a control signal rising from a low level to a high level, in a through mode to output the potential of the corresponding bit line, or, in response to a control signal falling from the high level to the low level, in a latch mode to latch and then output this potential;

clock means for generating a cyclic clock signal;

a dummy bit line;

a discharge circuit for discharging said dummy bit line and said plurality of bit lines to a discharge potential during a first half of a clock cycle;

a plurality of charge means respectively provided at the intersections of a plurality of word lines and said dummy bit line for charging said dummy bit line during a latter half of the clock cycle when the corresponding word lines are enabled by a row decoder; and a two-input AND gate, the first input receiving a signal obtained by inverting the clock signal and the second input receiving the potential of said dummy bit line, generating a control signal for switching the latch circuits to the latch mode at the beginning of the first half of the clock cycle and for generating a control signal for switching the latch circuits from the latch mode to the through mode during the latter half of the clock cycle when said dummy bit line is charged by one of said charge means to have a potential raised from the discharge potential to a predetermined potential.

* * * * *

UNITED STATES PATENT AND TRADEMARK OFFICE
CERTIFICATE OF CORRECTION

PATENT NO.  :  4,849,935
DATED       :  July 18, 1989
INVENTOR(S) :  Yuichi Miyazawa It is certified that error appears in the above-identified patent and that said Letters Patent is hereby corrected as shown below:

Claim 9, column 7, line 5, after "of", insert --a--.

Claim 9, column 6, line 59, change "ocupled" to --coupled--.

Claim 9, column 6, line 63, change "corresonding" to --corresponding--.

Signed and Sealed this

Twenty-third Day of October, 1990

Attest:

HARRY F. MANBECK, JR.

*Attesting Officer*     *Commissioner of Patents and Trademarks*